United States Patent [19]

Tozawa

[11] Patent Number: 5,625,323

[45] Date of Patent: Apr. 29, 1997

[54] FET GATE BIAS CIRCUIT

[75] Inventor: Norio Tozawa, Kawasaki, Japan

[73] Assignee: Fujitsu Limited, Kanagawa, Japan

[21] Appl. No.: 544,606

[22] Filed: Oct. 18, 1995

[30] Foreign Application Priority Data

Feb. 15, 1995 [JP] Japan ................................. 7-026634

[51] Int. Cl.$^6$ ................................................ H03F 3/16
[52] U.S. Cl. ................................................ 330/277; 330/296
[58] Field of Search ................................ 330/277, 296

[56] References Cited

FOREIGN PATENT DOCUMENTS 133110 10/1980 Japan ................................. 330/296
61-230425 10/1986 Japan .

*Primary Examiner*—James B. Mullins

[57] ABSTRACT

An FET gate bias circuit having a Schottky barrier gate incorporated therein is provided which can prevent gate voltage variations and thus provide a high-performance, high-reliability GaAs FET amplifier. The FET gate bias circuit includes a PNP transistor having a collector connected to a negative power supply, an NPN transistor having a collector thereof grounded and an emitter connected to the emitter of the PNP transistor, a Schottky barrier gate FET having a source grounded and a gate connected to the node between the emitters of the PNP transistor and NPN transistor, and a base voltage applying circuit for applying predetermined base voltages to the respective bases of the PNP transistor and NPN transistor.

5 Claims, 10 Drawing Sheets

FET GATE BIAS CIRCUIT

BACKGROUND OF THE INVENTION

1. Field of the Invention

The present invention relates to an FET gate bias circuit having a Schottky barrier gate incorporated therein, and more particularly, to a gate bias circuit for a GaAs FET amplifier used in the range from submicrowave band to microwave band.

2. Description of the Related Art

With recent development of higher-output GaAs FETs, an FET package capable of providing saturation output power of 30 watts or more has been made practicable and is used in radio equipment for mobile communications using the submicrowave band (1–3 GHz) or in a multiplex radio device, satellite base station, etc. using the microwave band. The present invention relates to an FET gate bias circuit for holding the bias voltage applied to the gate of a GaAs FET at a constant value regardless of the output power, thereby suppressing variations in the drain current of the GaAs FET.

A conventional GaAs FET gate bias circuit will be explained with reference to FIG. 8, which is a circuit diagram of an amplifier using a GaAs FET.

Figure 8:
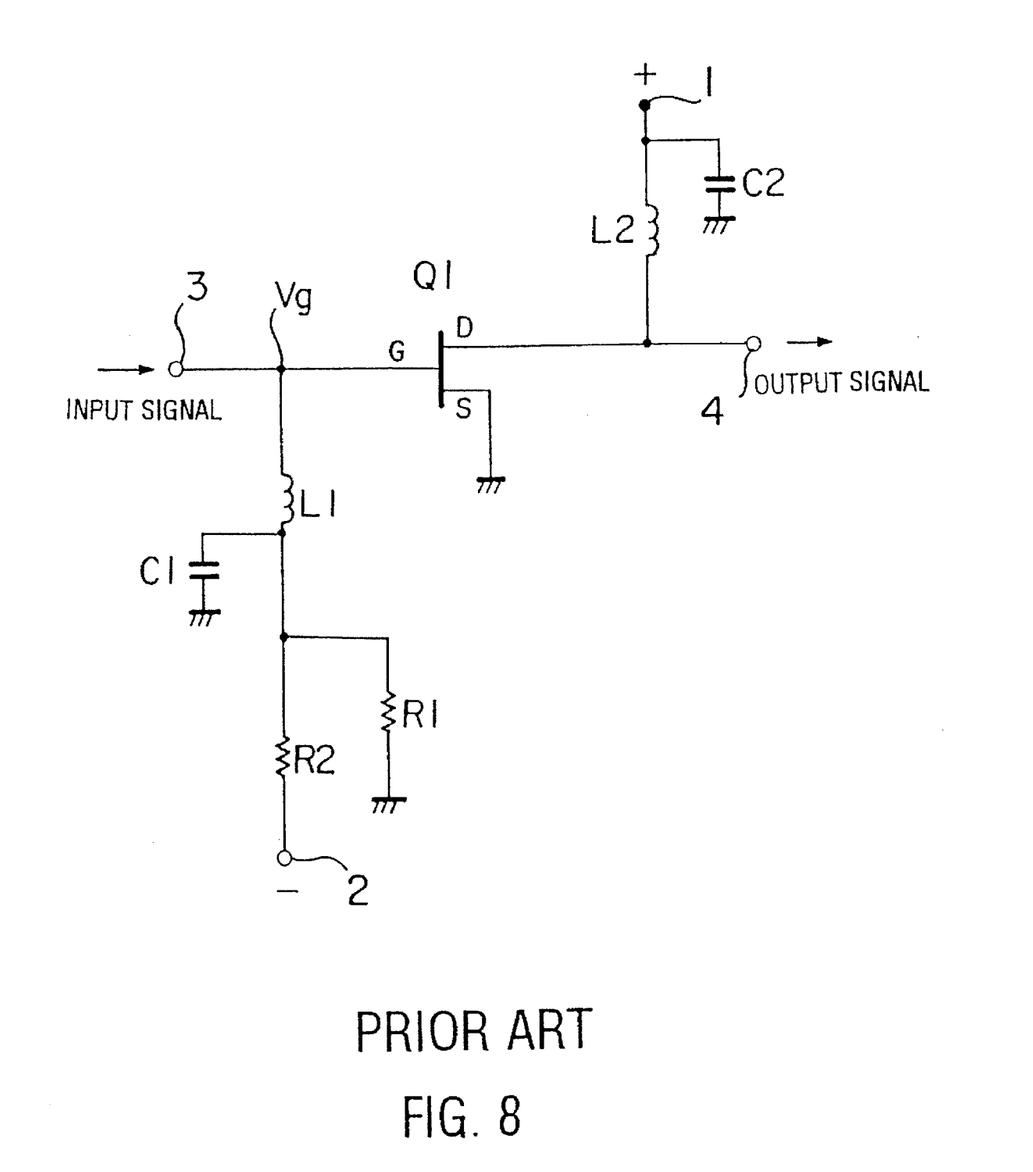
FIG. 8 is a diagram showing a conventional GaAs FET gate bias circuit.

A high-output GaAs FET is generally used as shown in the circuit diagram of FIG. 8. Specifically, the source (S) of a GaAs FET Q1 is grounded, a positive voltage is applied to a terminal 1 so that a positive bias voltage is applied to the drain (D), and a negative voltage is applied to a terminal 2 so that a negative bias voltage is applied to the gate (G).

Figure 9:
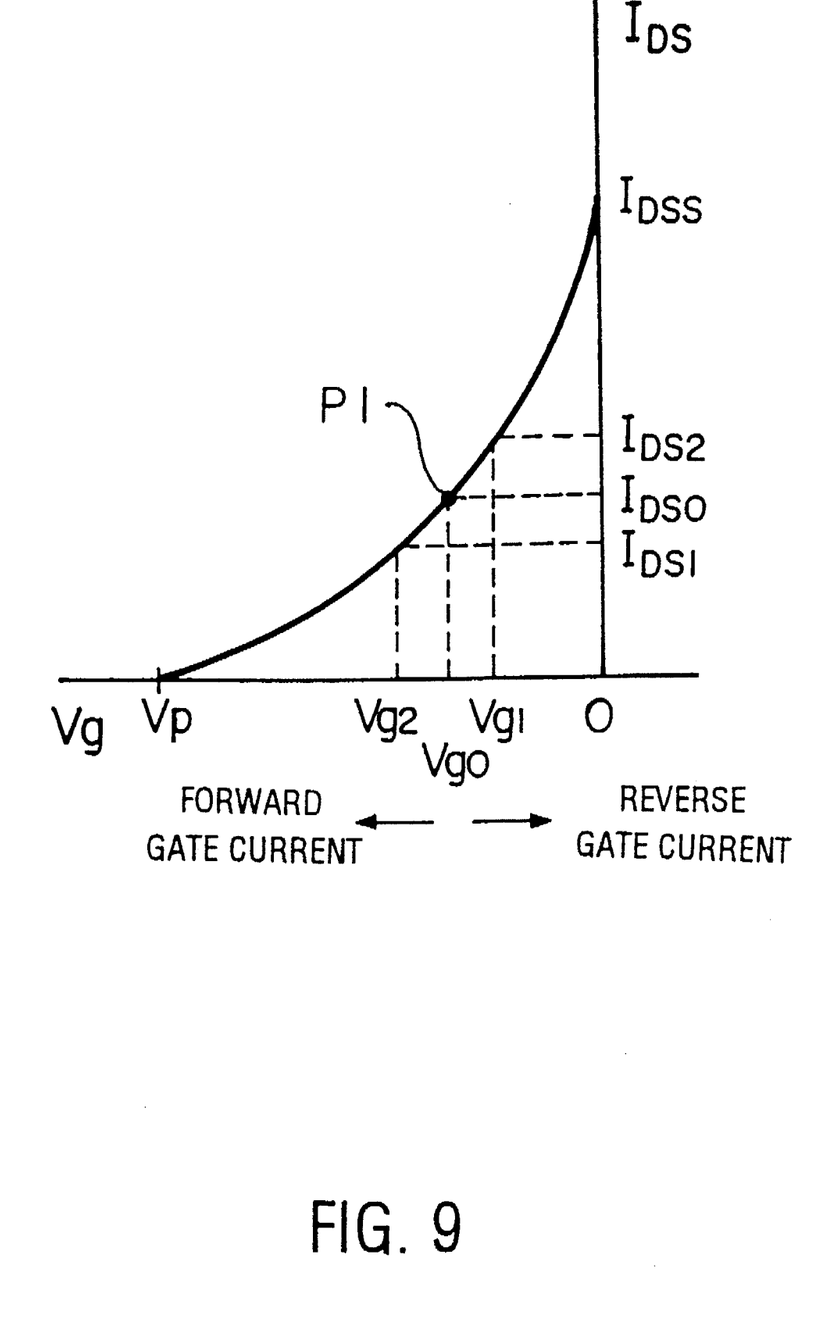
FIG. 9 is a graph showing, by way of example, a transfer characteristic of a GaAs FET and a bias change with gate current.

FIG. 9 shows the transfer characteristic of the FET Q1. In FIG. 9, the horizontal axis indicates the gate voltage Vg, the vertical axis indicates the drain current $I_{DS}$, and $I_{DSS}$ and $V_P$ represent the drain saturation current and the pinch-off voltage, respectively. In the case of performing class A amplification, a gate bias is set at point P1 in FIG. 9. More specifically, the gate voltage $V_{g0}$ at point P1 of the FET Q1 is –1 V or thereabouts.

Referring again to FIG. 8, in order to set the gate voltage Vg of the FET Q1 at –1 V or thereabouts, a voltage of about –5 V is applied to the terminal 2 and is divided by resistors R1 and R2. A signal is input to a terminal 3 and output from a terminal 4. A low-pass filter constituted by an inductor L1 and a capacitor C1 and a low-pass filter constituted by an inductor L2 and a capacitor C2 each serve as a high-frequency suppressing circuit.

Figure 10:
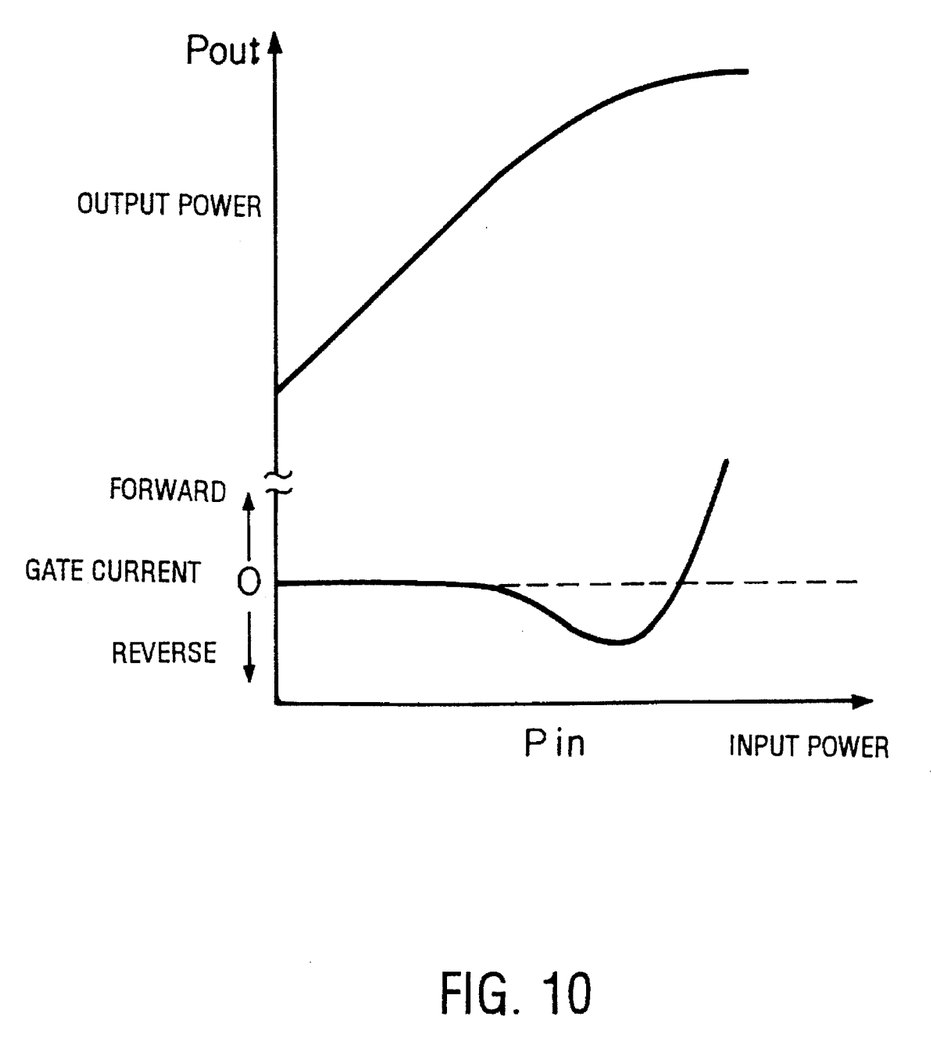
FIG. 10 is a graph showing a gate current characteristic in relation to an input/output characteristic and input power of an amplifier.

The GaAs FET constitutes a Schottky barrier gate, and since a reverse bias voltage is applied thereto, no gate current flows during small signal operation which is an operation of the GaAs FET upon the application of a signal having a small amplitude. However, when the GaAs FET is operated near the saturation output power with a large signal input thereto, current flows through the gate of the GaAs FET in both forward and reverse directions, as shown in FIG. 10. In the case where the GaAs FET is used to provide saturation output power of 10 watts or more, the gate current rises to about 10 mA. In the conventional gate bias circuit shown in FIG. 8, such gate current causes a voltage drop at the voltage dividing resistors R1 and R2; therefore, the gate voltage Vg of the FET Q1 and thus the drain current thereof undergo variations, causing variations of the output power.

Specifically, the forward gate current is the current flowing from the gate to the source of the FET Q1, and this current flows to the resistor R2, causing a voltage drop thereat. Consequently, the gate voltage Vg takes a large negative value (e.g., $V_{g2}$) and causes a reduction ($I_{DS1}$) of the drain current, as shown in FIG. 9, making it impossible to obtain predetermined output power.

The reverse gate current is the current flowing from the drain to the gate, and this current flows to the resistor R1, causing a voltage drop thereat. Consequently, the gate voltage Vg takes a small negative value (e.g., $V_{g1}$), causing an increase ($I_{DS2}$) of the drain current, as shown in FIG. 9. In a high-output GaAs FET, the quantity of heat generated thereby increases with increase in the drain current, and since the reverse gate current is associated with a positive temperature coefficient, the GaAs FET has the property that the reverse gate current increases with increase in the temperature of the GaAs FET. Accordingly, if reverse gate current flow occurs in the FET Q1, the drain current increases, as mentioned above, and thus the temperature of the FET Q1 rises, which in turn causes an increase of the reverse gate current. If this cycle is repeated, that is, if thermal runaway occurs, the FET Q1 may finally be broken due to increased temperature.

Thus, gate current flow in the GaAs FET causes variations of the gate voltage Vg, which results in variations of the output power and even the breakdown of the GaAs FET.

SUMMARY OF THE INVENTION

It is an object of the present invention to provide an FET gate bias circuit in which gate voltage variations are eliminated to thereby provide a high-performance, high-reliability GaAs FET amplifier.

To achieve the above object, the present invention provides an FET gate bias circuit having a Schottky barrier gate incorporated therein. The FET gate bias circuit comprises a PNP transistor having a collector thereof connected to a negative power supply, an NPN transistor having a collector thereof grounded and an emitter thereof connected to an emitter of the PNP transistor, a Schottky barrier gate FET having a source thereof grounded and a gate thereof connected to a node between the emitter of the PNP transistor and the emitter of the NPN transistor, and base voltage applying means for applying predetermined base voltages to respective bases of the PNP transistor and the NPN transistor.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments according to the present invention will be outlined first.

Figure 1:
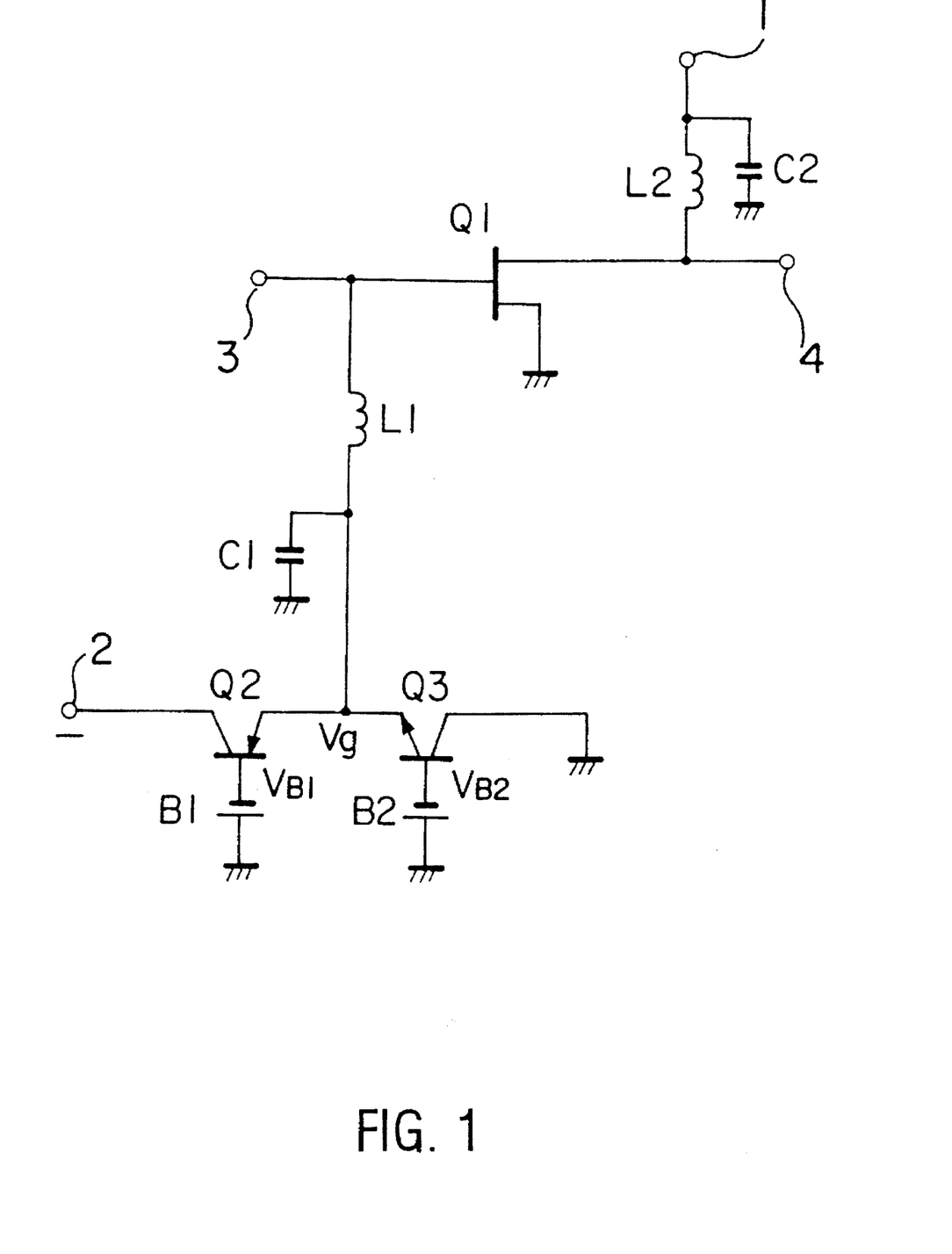
FIG. 1 is a diagram illustrating the principles of the present invention.

According to the present invention, to achieve the aforementioned object, there is provided an FET gate bias circuit which is characterized by comprising a PNP transistor Q2 having a collector thereof connected to a negative power supply, an NPN transistor Q3 having a collector thereof grounded and an emitter thereof connected to the emitter of the PNP transistor Q2, a Schottky barrier gate FET Q1 having a source thereof grounded and a gate thereof connected to a node between the emitter of the PNP transistor Q2 and the emitter of the NPN transistor Q3, and base voltage applying means B1 and B2 for applying predetermined base voltages to the base of the PNP transistor Q2 and the base of the NPN transistor Q3, respectively, as shown in FIG. 1.

The present invention eliminates an impedance component that causes a voltage drop due to the gate current of the FET Q1 of the gate bias circuit, and differs from the conventional circuit shown in FIG. 8 in that it does not have the resistors R1 and R2 which cause a voltage drop due to the gate current.

Specifically, when a forward gate current flows in the circuit shown in FIG. 1, this current flows to the NPN transistor Q3, increasing the collector current. A change in the gate voltage Vg caused at this time corresponds to a change in the voltage between the base and emitter of the NPN transistor Q3. Generally, however, since the change of the base-emitter voltage in response to change in the collector current is very small, the change of the gate voltage Vg is of a negligible level. Similarly, when reverse gate current flow occurs, this current flows to the PNP transistor Q2, increasing the collector current. A change in the gate voltage Vg caused at this time also corresponds only to a change in the base-emitter voltage of the PNP transistor Q2. Also in this case, since the change of the base-emitter voltage in response to change in the collector current is very small, the change of the gate voltage Vg is of a negligible level.

Accordingly, even if a gate current flows in the FET Q1, the gate voltage Vg undergoes almost no variations, whereby the output power is stabilized and no thermal runaway occurs, thus making it possible to provide a high-performance, high-reliability GaAs FET amplifier.

The embodiments of the present invention will be now described in detail.

Description of the embodiments will be made first with reference to FIG. 1. FIG. 1 is a circuit diagram of a GaAs FET amplifier provided with a gate bias circuit according to the present invention. The arrangement of the amplifier shown in FIG. 1 is basically identical to that of the amplifier shown in FIG. 8; therefore, like reference numerals are used to denote like elements and description thereof is omitted. In the following, only the differences are explained.

As shown in FIG. 1, the transistors Q2 and Q3 are provided as the gate bias circuit for the FET Q1. The transistor Q2 is a PNP transistor, and the transistor Q3 is an NPN transistor. The collector of the transistor Q2 is connected to a terminal 2 to which a negative voltage is supplied, and the collector of the transistor Q3 is grounded. The emitters of the transistors Q2 and Q3 are connected to each other, and the node between the emitters is connected to the gate of the FET Q1 via a low-pass filter constituted by an inductor L1 and a capacitor C1.

The bases of the transistors Q2 and Q3 are applied with base voltages $-V_{B1}$ and $-V_{B2}$, respectively. For example, a battery B1 is connected to the base of the transistor Q2 to apply the voltage $-V_{B1}$ thereto, and a battery B2 is connected to the base of the transistor Q3 to apply the voltage $-V_{B2}$ thereto.

The operation of the GaAs FET amplifier constructed as above will be now explained.

The gate voltage Vg of the FET Q1 and the collector currents flowing in the transistors Q2 and Q3, respectively, are determined by setting the individual base voltages $-V_{B1}$ and $-V_{B2}$ of the transistors Q2 and Q3 in the manner described below. Provided the base-emitter voltage of the transistor Q2 is $V_{BE1}$ and the base-emitter voltage of the transistor Q3 is $V_{BE2}$, the gate voltage Vg for the transistor Q2 and that for the transistor Q3 are given by the following equations (1) and (2), respectively, in the case where no gate current flows in the FET Q1:

$$Vg = -V_{B1} + V_{BE1} \qquad (1)$$

$$Vg = -V_{B2} - V_{BE2} \qquad (2)$$

Assuming, for simplicity of explanation, that the base-emitter voltage-to-collector current characteristics of the respective transistors Q2 and Q3 show an identical curve and differ from each other only in the directions of voltage and current, then from the above equations (1) and (2), $$V_{BE1} = V_{BE2} = (V_{B1} - V_{B2})/2 \qquad (3)$$

is derived.

It is, therefore, possible to obtain the base-emitter voltages $V_{BE1}$ and $V_{BE2}$ from the known base voltages $-V_{B1}$ and $-V_{B2}$ according to equation (3), and to obtain the collector currents from the respective base-emitter voltage-to-collector current characteristics by using the base-emitter voltages $V_{BE1}$ and $V_{BE2}$ thus obtained. Also, the gate voltages Vg can be obtained from the base-emitter voltages $V_{BE1}$ and $V_{BE2}$ and the known base voltages $-V_{B1}$ and $-V_{B2}$ according to equations (1) and (2).

When no signal or a small signal is input to an input terminal 3 of the amplifier, no gate current flows in the FET Q1, but when a large signal near the saturation output power is input to the input terminal 3 of the amplifier, current flows through the gate in forward and reverse directions. The forward current, which flows from the bias circuit to the gate, increases the collector current of the transistor Q3. A change in the gate voltage Vg caused at this time is equivalent only to a change in the base-emitter voltage $V_{BE2}$ which is dependent on the base-emitter voltage-to-collector current characteristic of the transistor Q3.

Figure 2:
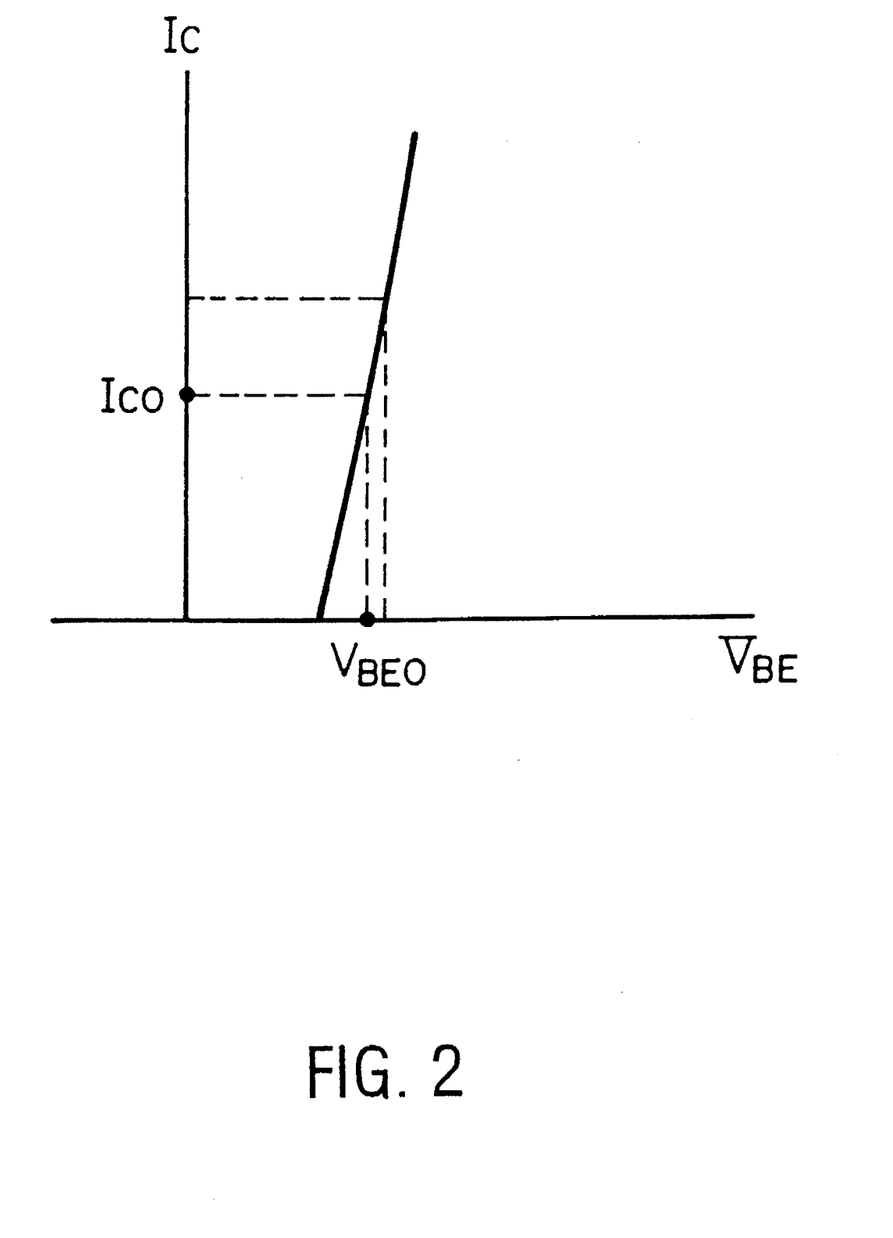
FIG. 2 is a graph showing a base-emitter voltage-to-collector current characteristic.

Generally, the base-emitter voltage ($V_{BE}$)-to-collector current ($I_C$) characteristic shows a curve as shown in FIG. 2. In FIG. 2, the vertical axis employs a logarithmic scale, and $I_{CO}$ and $V_{BE0}$ represent the collector current value and base-emitter voltage value, respectively, when no gate current flows. As seen from FIG. 2, the change of the base-emitter voltage in response to change in the collector current is very small. Therefore, the aforementioned change of the base-emitter voltage $V_{BE2}$ in response to the increase of the collector current is very small. Thus, even if forward gate current flow occurs, the resulting change in the gate voltage Vg is extremely small.

On the other hand, a reverse gate current increases the collector current of the transistor Q2. Also in this case, even if reverse gate current flow occurs, the resulting change in the gate voltage Vg is extremely small, for the same reason as explained with respect to the forward gate current.

Figure 3:
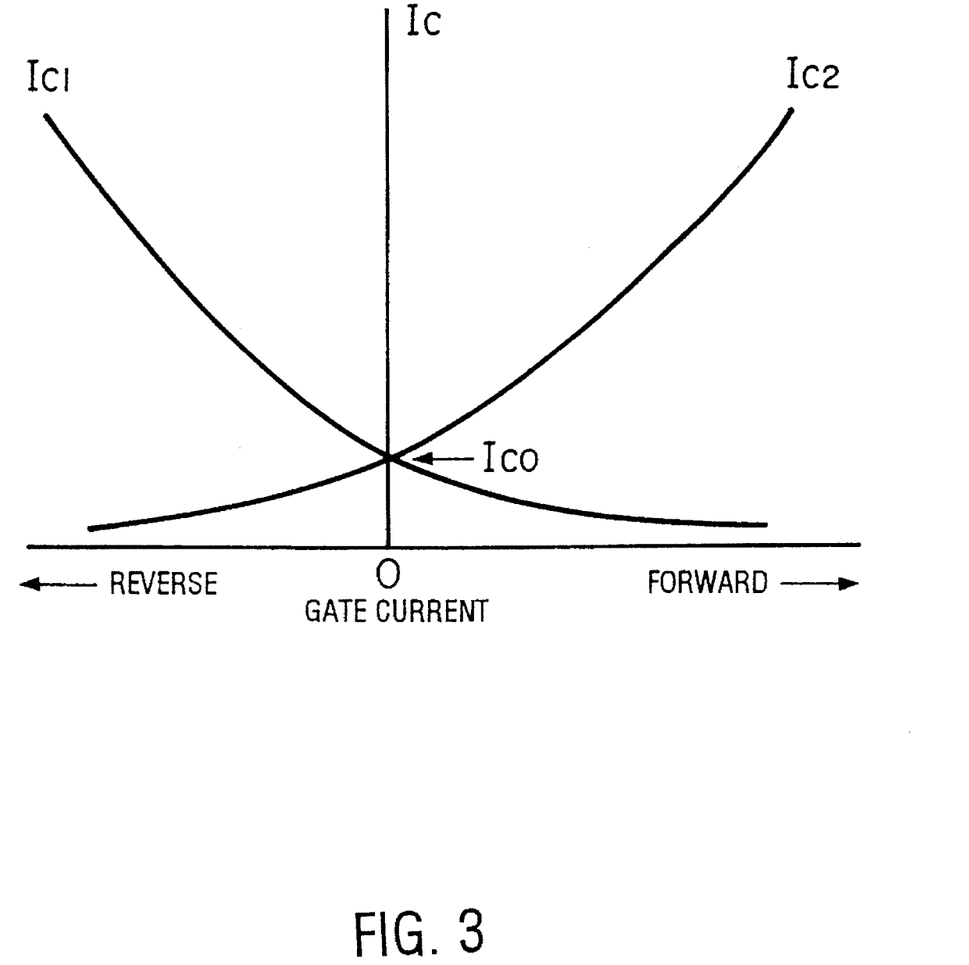
FIG. 3 is a graph showing the relationship between gate current and collector current of a transistor.

FIG. 3 illustrates the relationship between the gate current, which is calculated on the assumption that the gate current is a current source for the circuit shown in FIG. 1, and the collector current of each of the transistors. Symbol $I_{C1}$ denotes the collector current of the transistor Q2, and $I_{C2}$ denotes the collector current of the transistor Q3. In FIG. 3, when no gate current flows, the quantities ($I_{C0}$) of the collector currents of the transistors Q2 and Q3 are the same. When a forward gate current flows, the collector current $I_{C2}$ increases because the gate current is supplied by means of the collector current $I_{C2}$. The collector current $I_{C1}$ of the transistor Q2 decreases at this time, since the gate voltage Vg takes a somewhat large negative value and thus the base-emitter voltage $V_{BE1}$ of the transistor Q2 slightly decreases. On the other hand, a reverse gate current is supplied by means of the collector current $I_{C1}$ of the transistor Q2, and the above explanation of the forward gate current also applies to this case.

Figure 4:
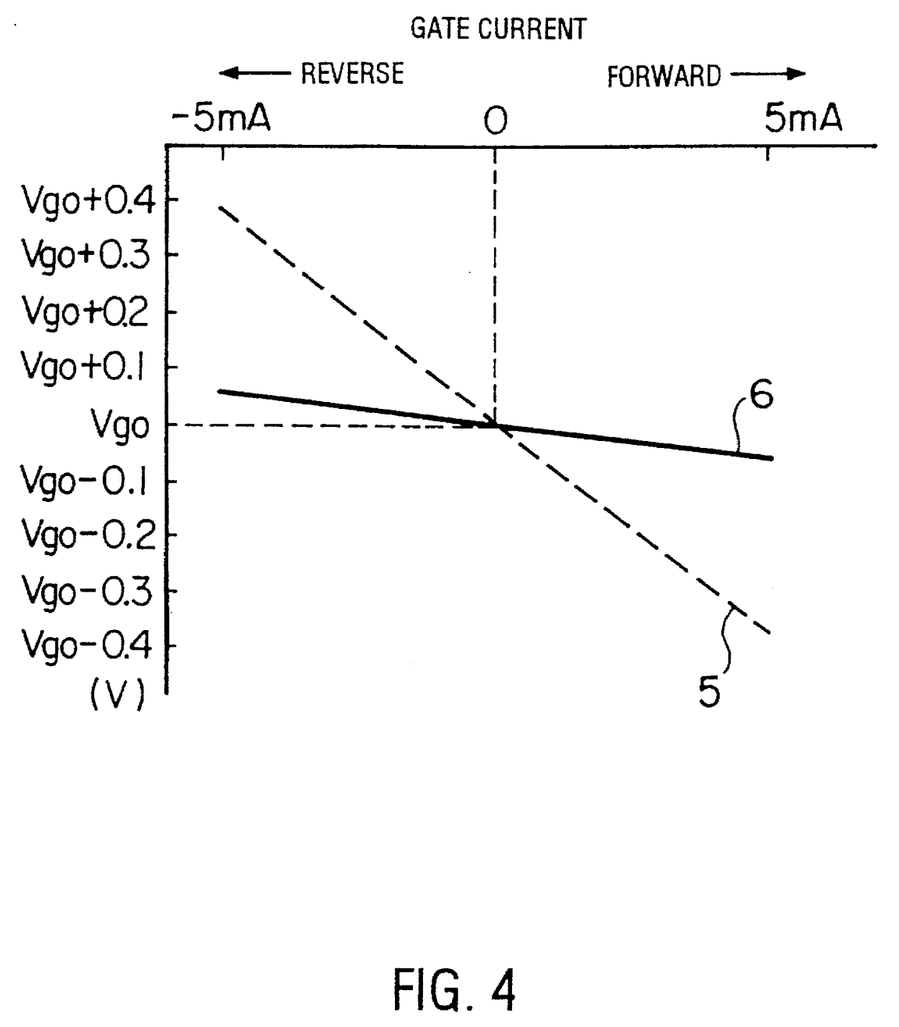
FIG. 4 is a graph showing gate voltage in relation to gate current.

FIG. 4 shows the gate voltage in relation to the gate current, wherein the vertical axis indicates the gate voltage and the horizontal axis indicates the gate current. First, in the conventional circuit shown in FIG. 8, let it be assumed that −5 V is applied to the terminal 2 and the resistors R1 and R2 have resistances of 83 Ω and 333 Ω, respectively, so that the gate voltage Vg may be −1V when no gate current flows (at this time, a current of 12 mA flows through the resistors R1 and R2). In this case, the gate voltage shows a change of 0.4 V in response to generation of 5 mA gate current, as indicated by dashed line 5 in FIG. 4. In FIG. 4, $V_{g0}$ represents the gate voltage value −1 V observed when no gate current flows. According to the embodiment of the present invention, the gate voltage shows only a small change of 0.06 V in response to generation of 5 mA gate current under the same conditions as employed in the conventional circuit of FIG. 8, as indicated by solid line 6 in FIG. 4.

A first embodiment of the present invention will be now described.

Figure 5:
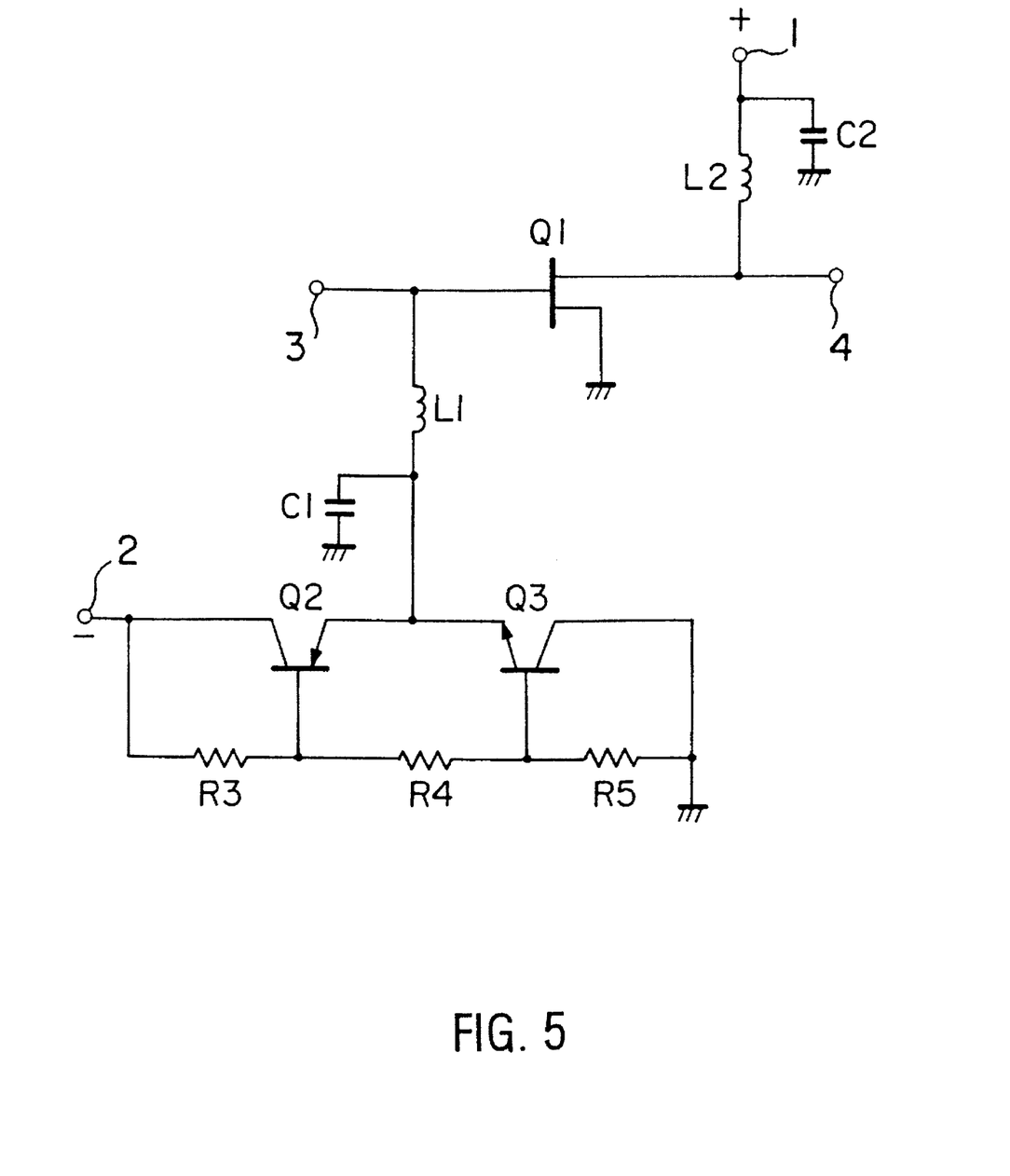
FIG. 5 is a diagram of a circuit according to a first embodiment.

FIG. 5 illustrates a circuit according to the first embodiment. The circuit arrangement shown in FIG. 5 is basically identical to that shown in FIG. 1; therefore, like reference numerals are used to denote like elements and description thereof is omitted. In the following, only the differences are explained.

In the first embodiment, the gate voltage Vg of the FET Q1, and the base voltages $-V_{B1}$ and $-V_{B2}$ of the transistors Q2 and Q3 which determine the collector currents thereof are set by means of the voltage division ratio of resistors R3 to R5. Specifically, the resistor R3 is connected between the terminal 2 and the base of the transistor Q2, the resistor R4 is connected between the bases of the transistors Q2 and Q3, and the resistor R5 is connected between the base of the transistor Q3 and the ground. Accordingly, a negative voltage applied to the terminal 2 is divided by the resistors R3 to R5, and the divided voltages are applied to the respective bases of the transistors Q2 and Q3. The predetermined base voltages $-V_{B1}$ and $-V_{B2}$ can be obtained by suitably selecting the individual resistances of the resistors R3 to R5.

In the transistors Q2 and Q3, the collector current changes when the gate current flows, and this change of the collector current reveals itself as a change of the base current. The change of the base current is 1/β times the change of the collector current (β is the current amplification factor of the transistor), and since β usually has a value of 100 to 200, the base current scarcely changes even when the gate current flows. Therefore, in the circuit of the first embodiment, the base voltages are scarcely influenced by the flow of the gate current, and thus the gate voltage Vg of the FET Q1 is not influenced by the gate current.

A second embodiment according to the present invention will be now described.

Figure 6:
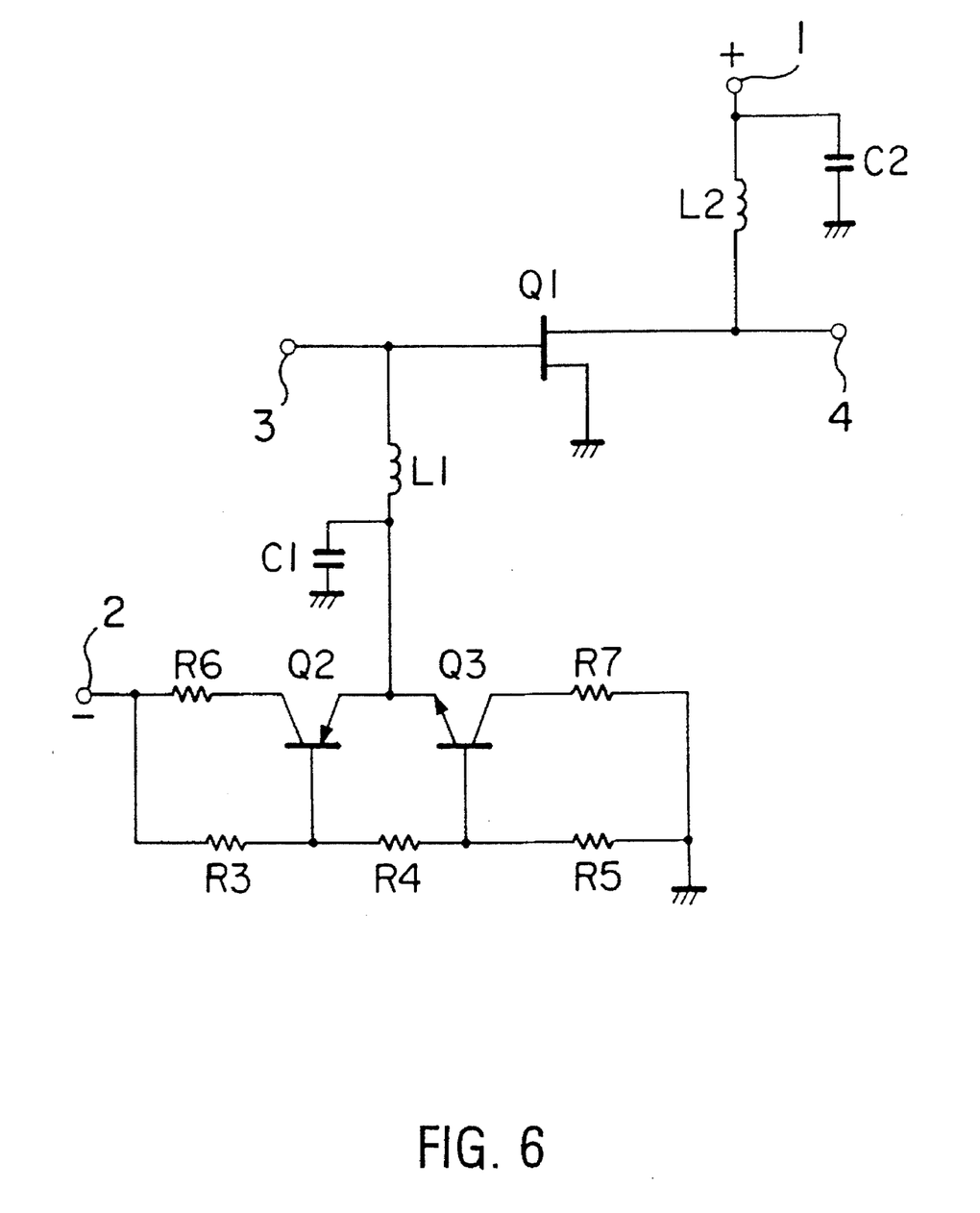
FIG. 6 is a diagram of a circuit according to a second embodiment.

FIG. 6 illustrates a circuit according to the second embodiment. The circuit arrangement shown in FIG. 6 is basically identical to that of the first embodiment shown in FIG. 5; therefore, like reference numerals are used to denote like elements and description thereof is omitted. In the following, only the differences are explained.

In the second embodiment, a resistor R6 is connected between the collector of the transistor Q2 and the terminal 2, and a resistor R7 is connected between the collector of the transistor Q3 and the ground. It is important to learn how much gate current flows when the amplifier using the GaAs FET is in operation; since the resistors R6 and R7 are inserted as illustrated, the gate current can be easily calculated by measuring the voltage drops of the inserted resistors.

In the conventional circuit, if an ammeter is inserted in a circuit through which the gate current flows in order to measure the gate current, a voltage drop attributable to the internal resistance of the ammeter changes the gate voltage, making it impossible to accurately measure the gate current. However, in the second embodiment, since the gate voltage Vg is dependent only on the base voltages of the transistors Q2 and Q3, the gate voltage Vg is not influenced if the resistors R6 and R7 are inserted, whereby the gate current can be easily observed during actual operation.

A third embodiment according to the present invention will be now described.

Figure 7:
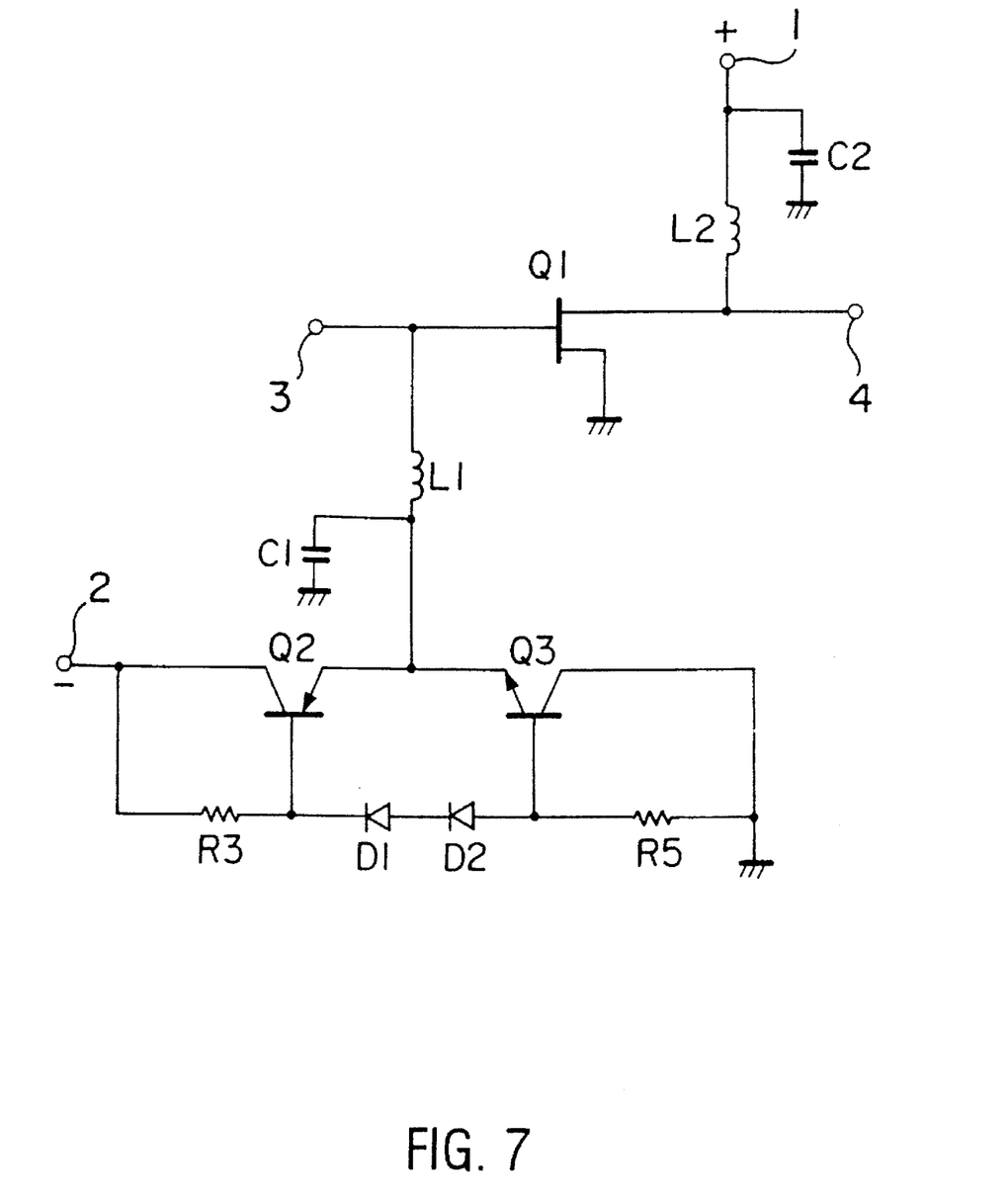
FIG. 7 is a diagram of a circuit according to a third embodiment.

FIG. 7 illustrates a circuit according to the third embodiment. The circuit arrangement shown in FIG. 7 is basically identical to that of the first embodiment shown in FIG. 5; therefore, like reference numerals are used to denote like elements and description thereof is omitted. In the following, only the differences are explained.

In the third embodiment, diodes D1 and D2 connected in series are used in place of the resistor R4 of the first embodiment shown in FIG. 5. Namely, in order to set the gate voltage Vg of the first embodiment at a desired value, it is necessary that the base voltages be changed and thus the voltage division ratio of the resistors R3 to R5 be changed. If, however, the voltage division ratio of the resistors R3 to R5 is changed, the voltage between the bases of the transistors Q2 and Q3 also changes, resulting in changes of the collector currents. Meanwhile, there is no resistor between the emitters of the transistors Q2 and Q3, and therefore, the gate voltage Vg is unstable and is difficult to settle. Thus, the collector currents should preferably be maintained as constant as possible, and change in the collector currents is not desirable.

In the third embodiment, the base voltages can be changed by changing the resistances of the resistors R3 and R5, and thus the gate voltage Vg can be set at a desired value. Further, since the voltage between the bases of the transistors Q2 and Q3 is maintained almost constant by the diodes D1 and D2, changes of the collector currents are small. It is, therefore, possible to set the gate voltage Vg at a desired value while maintaining the collector currents of the bias circuit almost constant, permitting the time for adjustment to be shortened.

In the third embodiment, two diodes D1 and D2 are inserted between the bases of the transistors Q2 and Q3. Basically, however, any series connection of diodes can meet the requirement insofar as the voltage across the series connection of diodes is greater than or equal to the sum of the base-emitter voltages of the transistors Q2 and Q3; therefore, the number of diodes to be inserted is not limited to two.

Although the foregoing embodiments are explained taking the GaAs FET gate bias circuit as an example, the present invention is not limited in application to the GaAs FET and can be applied to gate bias circuits for FETs in general, which constitute Schottky barrier gates.

As described above, according to the present invention, two transistors, PNP type and NPN type, are provided in the gate bias circuit of a high-output GaAs FET, and the gate current, if flows in the GaAs FET, is allowed to flow to the emitters of the two transistors so that the gate voltage can be set by means of the base voltages and base-emitter voltages of the transistors. Accordingly, even when the high-output GaAs FET amplifier is operated near the saturation output power, the gate voltage can be maintained almost constant, whereby the output power is stabilized and no thermal runaway occurs, making it possible to provide a high-performance, high-reliability GaAs FET amplifier.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An FET gate bias circuit having a Schottky barrier gate incorporated therein, comprising:

a PNP transistor having a collector thereof connected to a negative power supply;

an NPN transistor having a collector thereof grounded and an emitter thereof connected to an emitter of said PNP transistor;

a Schottky barrier gate FET having a source thereof grounded and a gate thereof connected to a node between the emitter of said PNP transistor and the emitter of said NPN transistor; and base voltage applying means for applying predetermined base voltages to respective bases of said PNP transistor and said NPN transistor.

2. The FET gate bias circuit according to claim 1, wherein said base voltage applying means comprises a battery for applying a first predetermined base voltage to the base of said PNP transistor, and a battery for applying a second predetermined base voltage to the base of said NPN transistor.

3. The FET gate bias circuit according to claim 1, wherein said base voltage applying means comprises a series connection of three resistors, one end of which is grounded and another end of which is connected to a negative power supply, for applying divided voltages to the respective bases of said PNP transistor and said NPN transistor in accordance with a ratio of resistances thereof.

4. The FET gate bias circuit according to claim 1, which further comprises a resistor connected between the collector of said PNP transistor and the negative power supply, and a resistor connected between the collector of said NPN transistor and ground.

5. The FET gate bias circuit according to claim 1, wherein said base voltage applying means comprises a first resistor connected between the collector and base of said PNP transistor, a second resistor connected between the collector and base of said NPN transistor, and a plurality of diodes connected in series between the base of said PNP transistor and the base of said NPN transistor.

* * * * *